(12) United States Patent
Jou et al.

(10) Patent No.: US 12,342,629 B2
(45) Date of Patent: Jun. 24, 2025

(54) ELECTROSTATIC DISCHARGE PROTECTION DEVICE

(71) Applicant: Vanguard International Semiconductor Corporation, Hsinchu (TW)

(72) Inventors: Yeh-Ning Jou, Hsinchu (TW); Jian-Hsing Lee, Hsinchu (TW); Chieh-Yao Chuang, Kaohsiung (TW); Hsien-Feng Liao, Taichung (TW); Ting-Yu Chang, Zhubei (TW); Chih-Hsuan Lin, Hsinchu (TW); Wen-Hsin Lin, Zhubei (TW); Hwa-Chyi Chiou, Hsinchu (TW)

(73) Assignee: VANGUARD INTERNATIONAL SEMICONDUCTOR CORPORATION, Hsinchu (TW)

( * ) Notice: Subject to any disclaimer, the term of this patent is extended or adjusted under 35 U.S.C. 154(b) by 435 days.

(21) Appl. No.: 18/146,762

(22) Filed: Dec. 27, 2022

(65) Prior Publication Data

US 2024/0213241 A1 Jun. 27, 2024

(51) Int. Cl.
*H10D 89/00* (2025.01)
*H10D 89/60* (2025.01)

(52) U.S. Cl.
CPC ......... *H10D 89/921* (2025.01); *H10D 89/713* (2025.01)

(58) Field of Classification Search
None
See application file for complete search history.

(56) References Cited

U.S. PATENT DOCUMENTS

| | | | |
|---|---|---|---|
| 2004/0016992 A1* | 1/2004 | Mallikarjunaswamy | H10D 8/80 257/362 |
| 2006/0215337 A1* | 9/2006 | Wu | H10D 89/713 361/56 |
| 2008/0198519 A1* | 8/2008 | Lim | H10D 89/713 257/360 |
| 2008/0217650 A1* | 9/2008 | Morishita | H10D 89/713 257/E29.225 |
| 2012/0205714 A1* | 8/2012 | Salcedo | H10D 84/0112 257/140 |
| 2014/0159206 A1* | 6/2014 | Hsu | H10D 89/813 438/514 |
| 2014/0167101 A1* | 6/2014 | Bobde | H10D 89/713 257/146 |

(Continued)

*Primary Examiner* — Bilkis Jahan
(74) *Attorney, Agent, or Firm* — Birch, Stewart, Kolasch & Birch, LLP

(57) ABSTRACT

An ESD protection device includes a substrate, an epitaxial layer, first to third well regions, and first to sixth doped regions. The first to third well regions are disposed in the epitaxial layer. The third well region is disposed between the first and second well regions. The first and second doped regions are disposed on the first well region and coupled to a pad. The third and fourth doped regions are disposed on the second well region and coupled to a ground terminal. The fifth doped region is disposed on the third well region, and the sixth doped region is disposed in the fifth doped region. The third, fifth, and sixth doped regions have the same conductive type. In response to an electrostatic discharge event occurring on the pad, a discharge path is formed between the pad and the ground terminal.

20 Claims, 6 Drawing Sheets

(56) References Cited

U.S. PATENT DOCUMENTS

2017/0062406 A1\* 3/2017 Ko ................. H10D 18/251
2017/0309612 A1\* 10/2017 Lin .................. H10D 89/713

\* cited by examiner

ELECTROSTATIC DISCHARGE PROTECTION DEVICE

BACKGROUND OF THE INVENTION

Field of the Invention

The present invention relates to an electrostatic discharge (ESD) protection device, and more particularly, to a bidirectional electrostatic discharge protection device.

Description of the Related Art

As the process of manufacturing integrated circuits has developed, the size of semiconductor components has been reduced to the sub-micron level to improve the performance and operation speed of the integrated circuits. However, this reduction of the size of components has caused some reliability problems. This is particularly true for integrated circuits, in which protection against electrostatic discharge (ESD) is seriously affected. Therefore, there is a need in the art for devices that can effectively provide paths for electrostatic discharge.

BRIEF SUMMARY OF THE INVENTION

An exemplary embodiment of the present invention provides an electrostatic discharge protection device. The electrostatic discharge protection device comprises a semiconductor substrate, an epitaxial layer, a first well region, a second well region, a third well region, a first doped region, a second doped region, a third doped region, a fourth doped region, a fifth doped region, and a sixth doped region. The semiconductor substrate has a first conductivity type. The epitaxial layer is located on the semiconductor substrate and has the first conductivity type. The first well region is disposed in the epitaxial layer and has the first conductivity type. The second well region is disposed in the epitaxial layer and has the first conductivity type. The third well region is set in the epitaxial layer and is located between the first well region and the second well region. The third well region has a second conductivity type that is the opposite of the first conductivity type. The first doped region is disposed on the first well region and has the first conductivity type. The second doped region is disposed on the first well region, and the second doped region has a second conductivity type. The third doped region is disposed on the second well region and has the first conductivity type. The fourth doped region is disposed on the second well region and has the second conductivity type. The fifth doped region is disposed on the third well region and has the second conductivity type. The sixth doped region is disposed in the fifth doped region and has the second conductivity type. The first doped region and the second doped region are coupled to a bonding pad, and the third doped region and the fourth doped region are coupled to a ground terminal. When an electrostatic discharge event occurs on the bonding pad, a discharge path is formed between the bonding pad and the ground.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is made for the purpose of illustrating the general principles of the invention and should not be taken in a limiting sense. The scope of the invention is best determined by reference to the appended claims.

Figure 1:
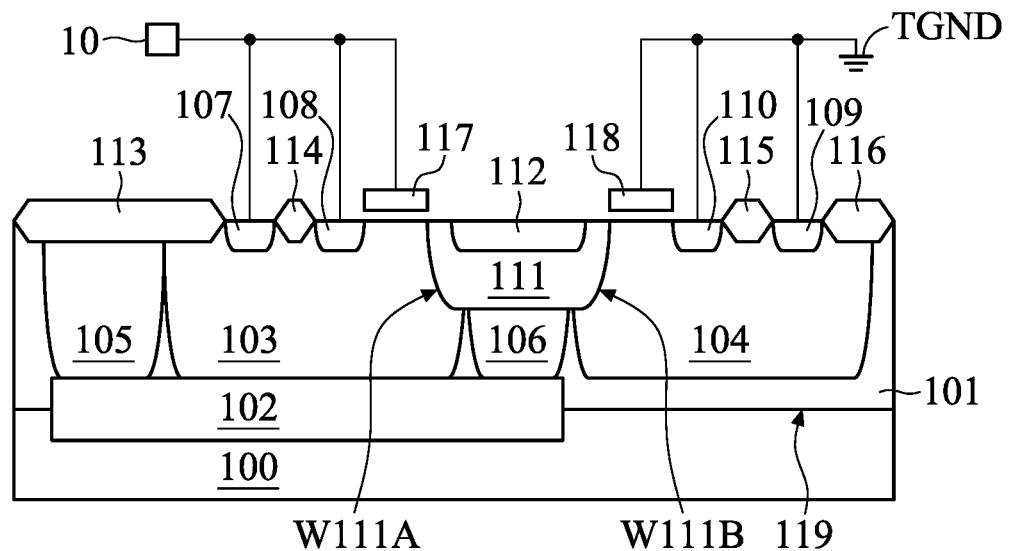
FIG. 1 is a schematic cross-sectional view of an electrostatic discharge (ESD) protection device according to one embodiment of the present invention.

FIG. 1 is a schematic cross-sectional view of an electrostatic discharge (ESD) protection device according to one embodiment of the present invention. Referring to FIG. 1, the electrostatic discharge protection device 1 is a bidirectional electrostatic discharge protection device. When an electrostatic discharge event occurs on a bonding pad 10, the electrostatic discharge protection device 1 provides a discharge path in the direction from the bonding pad 10 to a ground terminal TGND or provides a discharge path in the direction from the ground terminal TGND to the bonding pad 10. The electrostatic discharge protection device 1 comprises a semiconductor substrate 100, an epitaxial layer 101, a buried layer 102, well regions 103-106, doped regions 107-112, isolation patterns 113-116, and gate structures 117 and 118. The doped regions 107 and 108 and the gate structure 117 are coupled to the bonding pad 10, and the doped regions 109 and 110 and the gate structure 118 are coupled to the ground terminal TGND.

In the embodiment, the semiconductor substrate 100 may comprise a silicon substrate. Alternatively, SiGe, a bulk semiconductor, a strained semiconductor, a compound semiconductor or other commonly used semiconductor substrates may be used as the semiconductor substrate 100. In the embodiment, the semiconductor substrate 100 may be doped with P-type or N-type dopants to change its conductive type according to customer designs. In the embodiment of FIG. 1, the semiconductor substrate 100 may have a first conductive type such as P-type.

Referring to FIG. 1, an epitaxial layer 101 is formed on a semiconductor substrate 100. In the embodiment, the conductivity type of the epitaxial layer 101 is P-type (first conductivity type). The buried layer 102 is disposed at an interface 119 between the epitaxial layer 101 and the semiconductor substrate 100. In the embodiment, the buried layer 102 has a second conductivity type such as N-type.

As shown in FIG. 1, the well regions 103-106 are disposed in the epitaxial layer 101. In the embodiment, the conductivity types of the well regions 103 and 104 are P-type (the first conductivity type), and the conductivity types of the well regions 105 and 106 are N-type (the second conductivity type). In order to clearly illustrate the arrangement and the conductivity types of the well regions 103-106, hereinafter, the well regions 103 and 104 are referred to as P-type well regions, and the well regions 105 and 106 are referred to as N-type well regions. Referring to FIG. 1, the P-type well region 103 is disposed between the N-type well regions 105 and 106, and the N-type well region 106 is disposed between the P-type well regions 103 and 104. The bottom surface of the P-type well region 103, the bottom surface of the N-type well region 105, and the bottom surface of the N-type well region 106 are all connected to or contact with the buried layer 102.

Referring to FIG. 1, both of the doped regions 107 and 108 are disposed on the P-type well region 103. Referring to FIG. 1, the doped region 107 is adjacent to the N-type well region 105, and the doped region 108 is adjacent to the N-type well region 106. The doped regions 107 and 108 are coupled to the bonding pad 10. In the embodiment, the conductivity type of the doped region 107 is P-type, and the doped region 107 may be implemented as a P-type heavily doped (P+) region. The conductivity type of the doped region 108 is N-type, and the doped region 108 may be implemented as an N-type heavily doped (N+) region. In order to clearly illustrate the arrangement and the conductivity types of the doped regions 107 and 108, hereinafter, the doped region 107 is referred to as a P-type doped region, and the doped region 108 is referred to as an N-type doped region.

As shown in FIG. 1, both of the doped regions 109 and 110 are disposed on the P-type well region 104. Referring to FIG. 1, the doped region 110 is adjacent to the N-type well region 106, and the doped region 109 is far away from the N-type well region 106. The doped regions 109 and 110 are coupled to the ground terminal TGND. In the embodiment, the conductivity type of the doped region 109 is P-type, and the doped region 109 may be implemented as a P-type heavily doped (P+) region. The conductivity type of the doped region 110 is N-type, and the doped region 110 may be implemented as an N-type heavily doped (N+) region. In order to clearly illustrate the arrangement and the conductivity types of the doped regions 109 and 110, hereinafter, the doped region 109 is referred to as a P-type doped region, and the doped region 110 is referred to as an N-type doped region.

Referring to FIG. 1, the doped region 111 is disposed on the N-type well region 106. The doped region 112 is disposed in the doped region 111, and the boundary of the doped region 112 is surrounded by the doped region 111. In the embodiment, the conductivity type of the doped region 111 is N-type, and the doped region 111 may be implemented as an N-type doped drift (NDD) region. The conductivity type of the doped region 112 is N-type, and doped region 112 may be implemented as an N-type heavily doped (N+) region. In order to clearly illustrate the arrangement and the conductivity types of the doped regions 111 and 112, hereinafter, the doped region 111 is referred to as an NDD region, and the doped region 112 is referred to as an N-type doped region. The NDD region 111 has two sidewalls W111A and W111B that are opposite to each other. In the embodiment of FIG. 1, the NDD region 111 extends from the N-type well region 106 toward the P-type well region 103 so that the sidewall W111A of the NDD region 111 is in contact with the P-type well region 103. Moreover, the NDD region 111 is formed by the N-type well region 106 extends toward the P-type well region 104 so that the sidewall W111B of the NDD region 111 is in contact with the P-type well region 104. Therefore, the NDD region 111 is disposed on the P-type well regions 103 and 104 and the N-type well region 106. Specifically, the NDD region 111 completely overlaps the N-type well region 106, the NDD region 111 partially overlaps the P-type well region 103, and the NDD region 111 also partially overlaps the P-type well region 104.

As shown in FIG. 1, the isolation patterns 113-116 are disposed on the epitaxial layer 101. In the embodiment, the isolation patterns 113-116 may be shallow trench isolation (STI) features. Referring to FIG. 1, the isolation pattern 113 fully covers the N-type well region 105 and partially covers the P-type well region 103, the isolation pattern 114 is disposed between the P-type doped region 107 and the N-type doped region 108, the isolation pattern 115 is disposed between the P-type doped region 109 and the N-type doped region 110, and the isolation pattern 116 partially covers the P-type well region 104.

Referring to FIG. 1, the gate structures 117 and 118 are respectively disposed on the P-type well regions 103 and 104. The gate structure 117 is disposed between the N-type doped region 108 and the NDD region 111 and coupled to the bonding pad 10. The gate structure 118 is disposed between the N-type doped region 110 and the NDD region 111 and coupled to the ground terminal TGND. According to the embodiment, each of the gate structures 117 and 118 may be constructed by a lower gate insulating layer and an upper gate layer. In the embodiment, the gate insulating layer may comprise commonly used dielectric materials such as oxide, nitride, oxynitride, oxycarbide, or combinations thereof. In another embodiment, the gate insulating layer may comprise high-dielectric constant (k) dielectric material such as aluminum oxide ($Al_2O_3$), hafnium oxide ($HfO_2$), hafnium oxynitride (HfON), hafnium silicate ($HfSiO_4$), zirconium oxide, ($ZrO_2$), zirconium oxynitride (ZrON), zirconium silicate ($ZrSiO_4$), yttrium oxide ($Y_2O_3$), lanthanum oxide ($La_2O_3$), cerium oxide ($CeO_2$), titanium oxide ($TiO_2$), tantalum oxide ($Ta_2O_5$), or combinations thereof. Further, in an embodiment, the gate layer may comprise silicon or polysilicon. In another embodiment, the gate layer may comprise amorphous silicon.

Figure 2:
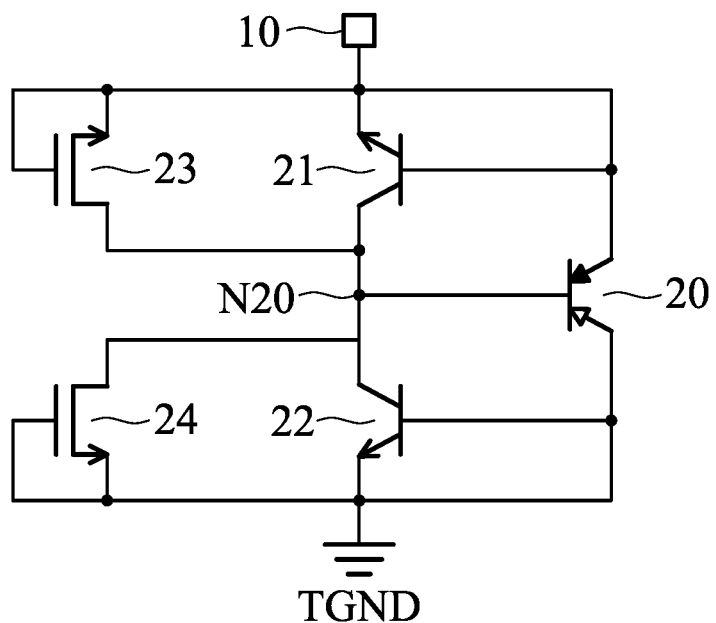
FIG. 2 shows a schematic diagram showing an equivalent circuit of an electrostatic discharge protection device according to one embodiment of the present invention.

FIG. 2 is a schematic diagram showing an equivalent circuit of the electrostatic discharge protection device 1. As shown in FIG. 2, the equivalent circuit of the electrostatic discharge protection device 1 comprises equivalent elements 20-24. Referring to FIG. 1 and FIG. 2, the P-type doped region 107, the P-type well region 103, the N-type buried layer 102, the N-type well region 106, the P-type well region 104, and the P-type doped region 109 are commonly form a PNP-type bipolar junction transistor (PNP BJT) 20, wherein the P-type doped region 107 and the P-type well region 103 serve as the first collector/emitter of the PNP BJT 20, the N-type buried layer 102 and the N-type well region 106 serve as the base of the PNP BJT 20, and the P-type well region 104 and the P-type doped region 109 serve as the second collector/emitter of the PNP BJT 20. The first collector/emitter of the PNP BJT 20 is coupled to the bonding pad 10, and the second collector/emitter of the PNP BJT 20 is coupled to the ground terminal TGND. Whether the first collector/emitter and the second collector/emitter of the PNP BJT 20 serves as a collector and an emitter respectively or as an emitter and a collector respectively depends on the polarity of the voltage caused by an electrostatic discharge event on the bonding pad 10 (a positive electrostatic discharge event or a negative electrostatic discharge event). Therefore, in FIG. 2, a solid arrow and a hollow arrow are used to indicate the emitter of the PNP BJT 20 respectively the different polarities of the above-mentioned voltage, and the related details will be described later.

The N-type doped region 108, the P-type well region 103, the NDD region 111, and the N-type doped region 112 commonly forms an N-P-N-type bipolar junction transistor (NPN BJT) 21, wherein the N-type doped region 108 serves as the emitter of the NPN BJT 21, the P-type well region 103 serves as the base of the NPN BJT 21, and the NDD region 111 and the N-type doped region 112 serve as the collector of the NPN BJT 21. The N-type doped region 110, the P-type well region 104, the NDD region 111, and the N-type doped region 112 commonly form an NPN BJT 22, wherein the N-type doped region 110 serves as the emitter of the NPN BJT 22, and the P-type well region 103 serves as the base of the NPN BJT 22, and the NDD region 111 and the N-type doped region 112 serve as the collector of the NPN BJT 22. Referring to FIG. 2, according to the structure shown in FIG. 1, the emitter and the base of the NPN BJT 21 are coupled to the bonding pad 10, the collector of the NPN BJT 21, the base of the PNP BJT 20, and the collector of the NPN BJT 22 are commonly coupled to the node N20, the emitter and the base of the NPN BJT 22 are coupled to the ground terminal TGND. The node N20 corresponds to the N-type buried layer 102, the N-type well region 106, the NDD region 111, and the N-type doped region 112 whose conductivity types are N-type and which are connected to each other in FIG. 1.

Referring to FIG. 1 and FIG. 2, the N-type doped region 108, the gate structure 117, and the N-type doped region 112 commonly form an N-type metal oxide semiconductor (NMOS) transistor 23, wherein, the N-type doped region 108 serves as the source of the NMOS transistor 23, the gate structure 117 serves as the gate of the NMOS transistor 23, and the N-type doped region 112 serves as the drain of the NMOS transistor 23. The N-type doped region 110, the gate structure 118, and the N-type doped region 112 commonly form an NMOS transistor 24, wherein the N-type doped region 110 serves as the source of the NMOS transistor 24, and the gate structure 118 serves as the gate of the NMOS transistor 24, and the N-type doped region 112 serves as the drain of the NMOS transistor 24. Referring to FIG. 2, according to the structure of FIG. 1, the gate and the source of the NMOS transistor 23 are coupled to the bonding pad 10, the drain of the NMOS transistor 23 and the drain of the NMOS transistor 24 are coupled to the node N20, and the gate and the source of the transistor 24 are coupled to the ground terminal TGND.

Referring to FIG. 1, when an electrostatic discharge event occurs on the bonding pad 10 to cause a positive voltage (or, when a positive electrostatic discharge event occurs on the bonding pad 10), the bonding pad 10, a discharge path is formed through the P-type The doped region 107, the P-type well region 103, the NDD region 111, the N-type doped region 112, the P-type well region 104, the N-type doped region 110, and the ground terminal TGND so that the electrostatic charges on the bonding pad 10 are conducted to the ground terminal TGND through this discharge path. That is, the above discharge path is from the bonding pad 10 and finally to the ground terminal TGND through a P-N-P-N junction. From the viewpoint of the equivalent circuit of the electrostatic discharge protection device 1, referring to FIG. 2, when an electrostatic discharge event occurs on the bonding pad 10 to cause a positive voltage, the PNP BJT 20 and the NPN BJT 22 are turned on. At this time, the first collector/emitter of the PNP BJT 20 serves as the emitter (indicated by the solid arrow). The PNP BJT 20 and the NPN BJT 22 form a silicon controlled rectifier (SCR). Corresponding to the discharge path on the semiconductor structure shown in FIG. 1, the electrostatic charges on the bonding pad 10 are conducted to the ground terminal TGND through the emitter and the base of the PNP BJT 20 and the collector, the base and the emitter of the NPN BJT 22 in sequence. In addition, the NMOS transistor 24 is turned on, and, thus, some of the electrostatic charges are conducted to the ground terminal TGND through the NMOS transistor 24.

Referring to FIG. 1, when an electrostatic discharge event occurs on the bonding pad 10 to cause a negative voltage (or, when a negative electrostatic discharge event occurs on the bonding pad 10), a discharge path is formed through the ground terminal TGND, the P-type doped region 109, the P-type well region 104, the NDD region 111, the N-type doped region 112, the P-type well region 103, the N-type doped region 108, and the bonding pad 10 so that the charges on the ground terminal TGND are conducted to the bonding pad 10 through this discharge path. That is, the above discharge path is from the ground terminal TGND and finally to the bonding pad 10 through a P-N-P-N junction. From the viewpoint of the equivalent circuit of the electrostatic discharge protection device 1, referring to FIG. 2, when an electrostatic discharge event occurs on the bonding pad 10 to cause a negative voltage, the PNP BJT 20 and the NPN BJT 21 are turned on. At this time, the second collector/emitter of the PNP BJT 20 serves as the emitter (indicated by the hollow arrow). The PNP BJT 20 and the NPN BJT 21 form a silicon controlled rectifier (SCR). Corresponding to the discharge path on the semiconductor structure in FIG., the charges on the ground terminal TGND are conducted to the bonding pad 10 through the emitter and the base of the PNP BJT 20, the collector, the base, and the emitter of the NPN BJT 21 in sequence. In addition, the NMOS transistor 23 is turned on, and, thus, some of the electrostatic charges are conducted to the ground terminal TGND through the NMOS transistor 23.

Referring to FIG. 1, the P-type well region 103 and the NDD region 111 form a first parasitic diode, and the P-type well region 104 and the NDD region 111 form a second parasitic diode. When a positive electrostatic discharge event occurs on the bonding pad 10, the second parasitic diode is reversely biased; when a negative electrostatic discharge event occurs on the bonding pad 10, the first parasitic diode is reversely biased. Therefore, the respective breakdown voltages of the first parasitic diode and the second parasitic diode affect the performance of the electrostatic discharge in the embodiment. According to an embodiment of the present invention, the respective breakdown voltages of the first parasitic diode and the second parasitic diode may be determined by changing the position of the NDD region 111 relative to the N-type well region 106.

Figure 3:
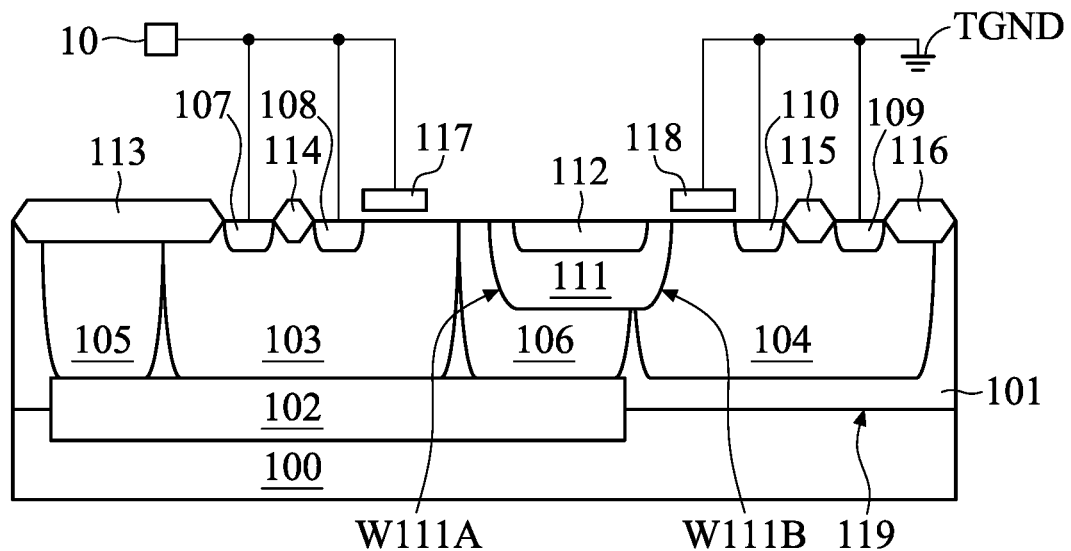
FIG. 3 shows a schematic cross-sectional view of an electrostatic discharge protection device according to another embodiment of the present invention.

Referring to FIG. 3, the position of the NDD region 111 relative to the N-type well region 106 is different from the embodiment shown in FIG. 1. As shown in FIG. 3, the NDD region 111 extends from the N-type well region 106 toward the P-type well region 104, so that the sidewall W111B of the NDD region 111 is in contact with the P-type well region 104. That is, the NDD region 111 extends above the P-type well region 104 and partly overlaps the P-type well region 104. However, the NDD region 111 does not extend above the P-type well region 103. The sidewall W111A of the NDD region 111 is in contact with the N-type well region 106, that is, the sidewall W111A is in the N-type well region 106. Compared with the embodiment shown in FIG. 1, the breakdown voltage of the first parasitic diode formed in the P-type well region 103 and the N-type well region 106 in FIG. 3 is higher. In addition, in the embodiment of FIG. 3, the breakdown voltage of the first parasitic diode is greater than the breakdown voltage of the second parasitic diode formed in the P-type well region 104 and the NDD region 111, which is beneficial to trigger formation of a discharge path when a positive electrostatic discharge event occurs on the bonding pad 10.

Figure 4:
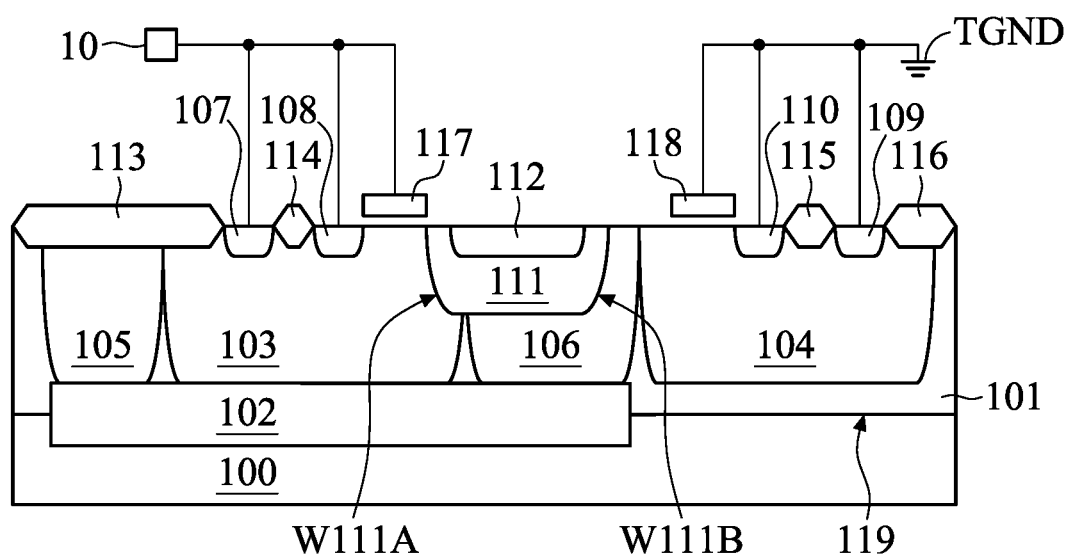
FIG. 4 is a schematic cross-sectional view of an electrostatic discharge protection device according to another embodiment of the present invention.

In another embodiment, as shown in FIG. 4, the NDD region 111 extends from the N-type well region 106 toward the P-type well region 103 so that the sidewall W111A of the NDD region 111 is in contact with the P-type well region 103. That is, the NDD region 111 extends above the P-type well region 103 and partially overlaps with the P-type well region 103. However, the NDD region 111 does not extend above the P-type well region 104. The sidewall W111B of the NDD region 111 is in contact with the N-type well region 106, that is, the sidewall W111B is in the N-type well region 106. Compared with FIG. 1, the breakdown voltage of the second parasitic diode formed in the P-type well region 104 and the N-type well region 106 in FIG. 4 is higher. In addition, in the embodiment of FIG. 4, the breakdown voltage of the second parasitic diode is greater than the breakdown voltage of the first parasitic diode formed in the P-type well region 103 and the NDD region 111, which is beneficial to trigger formation of a discharge path when a negative electrostatic discharge event occurs on the bonding pad 10.

Figure 5:
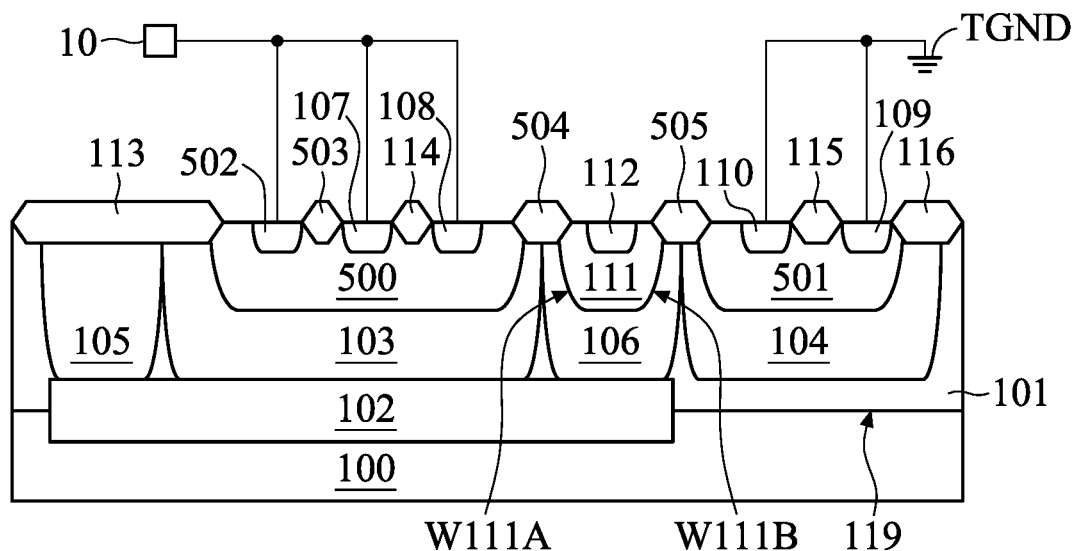
FIG. 5 is a schematic cross-sectional view of an electrostatic discharge protection device according to another embodiment of the present invention.

FIG. 5 is a schematic cross-sectional view of an electrostatic discharge protection device according to another embodiment of the present invention. Referring to FIG. 1 and FIG. 5, the difference between the electrostatic discharge protection device 5 shown in FIG. 5 and the electrostatic discharge protection device 1 shown in FIG. 1 is that the electrostatic discharge protection device 5 further comprises doped regions 500-502 and the isolation patterns 503-505. Moreover, the electrostatic discharge protection device 5 does not comprise the gate structures 117 and 118 of the electrostatic discharge protection device 1. In the embodiment, the conductivity types of the doped regions 500 and 501 are P-type, and the doped regions 500 and 501 may be implemented as P-type doped drift (PDD) regions. The conductivity type of the doped region 502 is N-type, and the doped region 502 may be implemented as an N-type heavily doped (N+) region. In order to clearly illustrate the arrangement and the conductivity types of the doped regions 500-502, hereinafter, the doped regions 500 and 501 are referred to as PDD regions, and the doped region 502 is referred to as an N-type doped region.

As shown in FIG. 5, the PDD region 500 is disposed on the P-type well region 103, and the boundary of the PDD region 500 is surrounded by the P-type well region 103. The PDD region 501 is disposed on the P-type well region 104, and the boundary of the PDD region 501 is surrounded by the P-type well region 104. Under this arrangement, the P-type doped region 107 and the N-type doped regions 108 and 502 are disposed in the PDD region 500, and the P-type doped region 109 and the N-type doped region 110 are disposed in the PDD region 501. The N-type doped region 502 is adjacent to the N-type well region 105 and coupled to the bonding pad 10. The P-type doped region 107 is disposed between the N-type doped regions 108 and 502.

Different from the embodiments shown in FIGS. 1, 3, and 4, the boundary of the NDD region 111 in FIG. 5 is surrounded by the N-type well region 106, that is, the NDD region 111 does not overlap the P-type well regions 103 and 104. In addition, the isolation patterns 503-505 are disposed on the epitaxial layer 101. In the embodiment, the isolation patterns 503-505 may be shallow trench isolation (STI) features. The isolation pattern 503 is disposed between the P-type doped region 107 and the N-type doped region 502. The isolation pattern 504 is disposed between the PDD region 500 and the NDD region 111 and partially covers the P-type well region 103 and the N-type well region 106. The isolation pattern 505 is disposed between the PDD region 501 and the NDD region 111 and partially covers the P-type well region 104 and the N-type well region 106.

Figure 6:
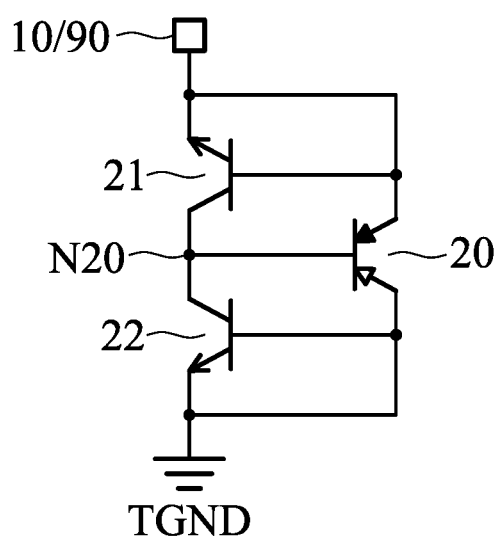
FIG. 6 shows a schematic diagram showing an equivalent circuit of an electrostatic discharge protection device according to another embodiment of the present invention.

FIG. 6 is a schematic diagram showing an equivalent circuit of the electrostatic discharge protection device 5. According to the above description, the PDD region 500 has the same conductivity type as the P-type well region 103, and the PDD region 501 has the same conductivity type as the P-type well region 104. Therefore, like the electrostatic discharge protection circuit 1, equivalent components of the electrostatic discharge protection device 5 comprise a PNP BJT 20, an NPN BJT 21, and an NPN BJT 22. In the embodiment of FIG. 5, since the electrostatic discharge protection device 5 does not comprise the gate structures 117 and 118 of the electrostatic discharge protection device 1, the equivalent elements of the electrostatic discharge protection device 5 do not comprises the NMOS transistors 23 and 24.

In the embodiments of FIG. 5 and FIG. 6, when a positive electrostatic discharge event or a negative electrostatic discharge event occurs on the bonding pad 10, a current path is formed through a P-N-P-N junction of a silicon controlled rectifier (SCR), which similar to the embodiments in FIG. 1 and FIG. 2. Thus, the related description is omitted here.

Similarly, the respective breakdown voltages of the first parasitic diode formed between the P-type well region 103 and the NDD region 111 and the second parasitic diode formed between the P-type well region 104 and the NDD region 111 in FIG. 1 can be determined by changing the position of the NDD region 111 relative to the N-type well region 106.

Figure 7:
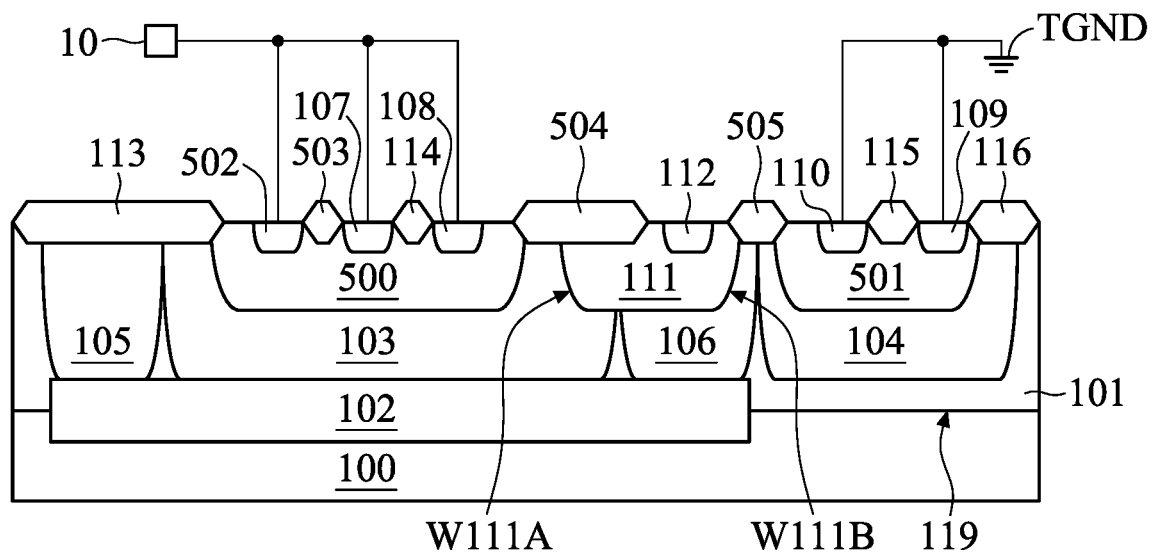
FIG. 7 is a schematic cross-sectional view of an electrostatic discharge protection device according to another embodiment of the present invention.

Referring to FIG. 7, the NDD region 111 extends from the N-type well region 106 toward the P-type well region 103 so that the sidewall W111A of the NDD region 111 is in contact with the P-type well region 103. That is, the NDD region 111 extends above the P-type well region 103 and partly overlaps the P-type well region 103. However, the NDD region 111 does not extend above the P-type well region 104. The sidewall W111B of the NDD region 111 is in contact with the N-type well region 106, that is, the sidewall W111B is in the N-type well region 106. Compared with FIG. 5, the NDD region 111 extends from the N-type well region 106 toward the P-type well region 103, resulting in that the breakdown voltage of the first parasitic diode between the P-type well region 103 and the NDD region 111 is lower, which is beneficial to triggering the formation of a discharge path when a negative electrostatic discharge event occurs on the bonding pad 10.

Figure 8:
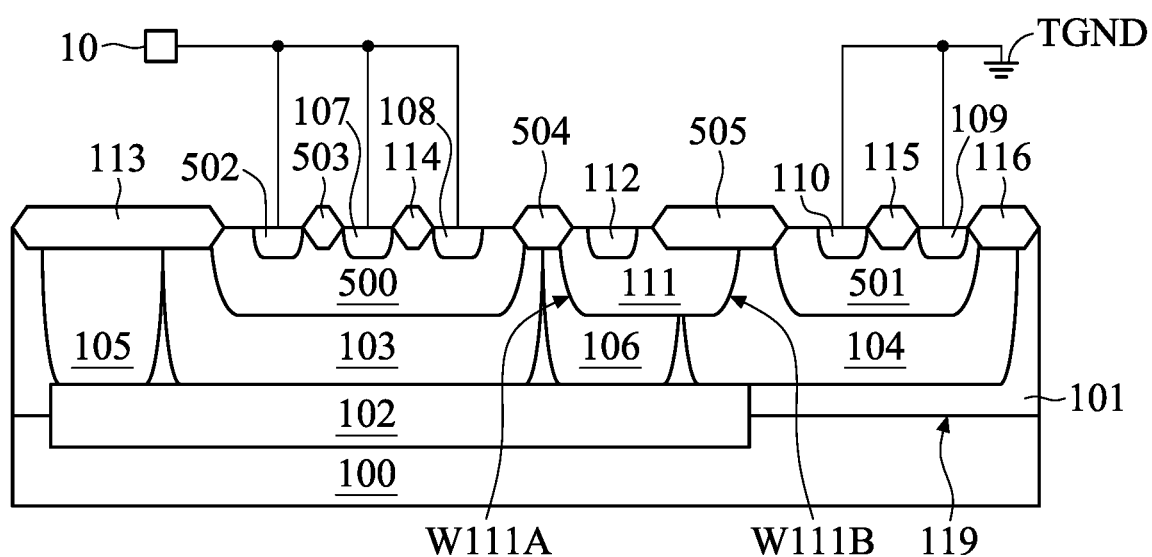
FIG. 8 is a schematic cross-sectional view of an electrostatic discharge protection device according to another embodiment of the present invention.

Referring to FIG. 8, the NDD region 111 extends from the N-type well region 106 toward the P-type well region 104 so that the sidewall W111B of the NDD region 111 is in contact with the P-type well region 104. That is, the NDD region 111 extends above the P-type well region 104 and partly overlaps with the P-type well region 104. However, the NDD region 111 does not extend above the P-type well region 103. The sidewall W111A of the NDD region 111 is in contact with the N-type well region 106, that is, the sidewall W111A is in the N-type well region 106. Compared to FIG. 5, the NDD region 111 extends from the N-type well region 106 toward the P-type well region 104 in FIG. 8, resulting in that the breakdown voltage of the second parasitic diode between the P-type well region 104 and the NDD region 111 is lower, which is beneficial to trigger formation of a discharge path when a positive electrostatic discharge event occurs on the bonding pad 10.

Figure 9:
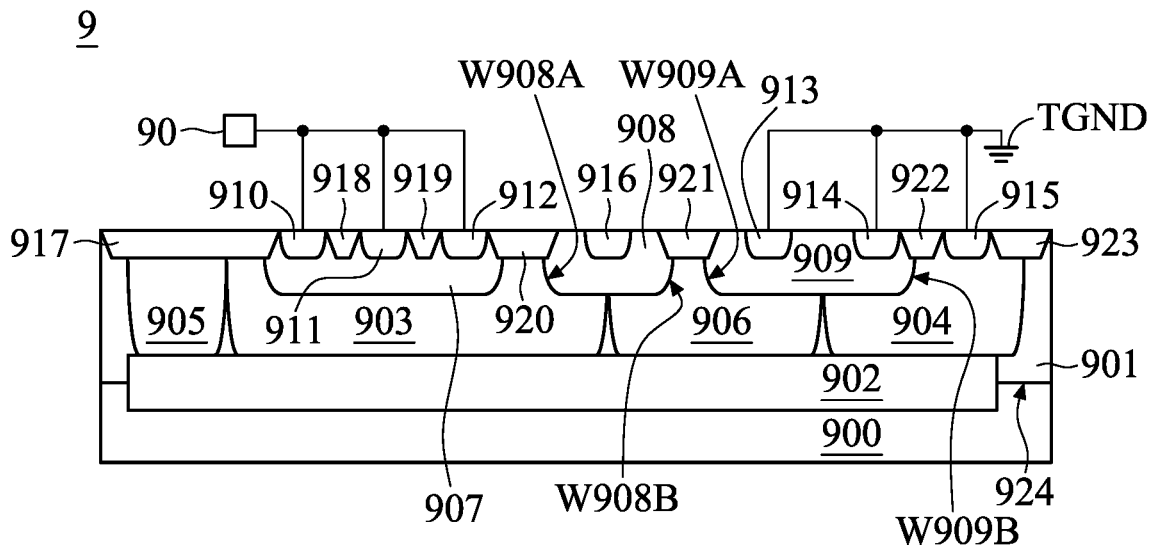
FIG. 9 is a schematic cross-sectional view of an electrostatic discharge protection device according to an embodiment of the present invention.

FIG. 9 is a schematic cross-sectional view showing an electrostatic discharge (ESD) protection device according to another embodiment of the present invention. Referring to FIG. 9, the electrostatic discharge protection device 9 is a bidirectional electrostatic discharge protection device. When an electrostatic discharge event occurs on a bonding pad 90, the electrostatic discharge protection device 9 provides a discharge path in the direction from the bonding pad 90 to a ground terminal TGND or a discharge path in the direction from the ground terminal TGND to the bonding pad 90. The electrostatic discharge protection device 9 comprises a semiconductor substrate 900, an epitaxial layer 901, a buried layer 902, well regions 903-906, doped regions 907-916, and isolation patterns 917-923. The doped regions 910-912 are coupled to the bonding pad 90, and the doped regions 913-915 are coupled to the ground terminal TGND. In the embodiment, the electrostatic discharge protection device 9 is formed by a process for manufacturing high-voltage devices.

In the embodiment, the semiconductor substrate 900 may comprise a silicon substrate. Alternatively, SiGe, a bulk semiconductor, a strained semiconductor, a compound semiconductor or other commonly used semiconductor substrates may be used as the semiconductor substrate 900. In the embodiment, the semiconductor substrate 900 may be doped with P-type or N-type dopants to change its conductive type according to customer designs. In the embodiment of FIG. 9, the semiconductor substrate 900 may have a first conductive type such as P-type.

Referring to FIG. 9, an epitaxial layer 901 is formed on a semiconductor substrate 900. In the embodiment, the conductivity type of the epitaxial layer 901 is P-type (first conductivity type). The buried layer 902 is disposed at an interface 924 between the epitaxial layer 901 and the semiconductor substrate 900. In the embodiment, the buried layer 902 has a second conductivity type such as N-type.

As shown in FIG. 9, well regions 903-906 are disposed in the epitaxial layer 901. In the embodiment, the conductivity types of the regions 903 and 904 are P-type (first conductivity type), and the regions 903 and 904 may be implemented as high-voltage P-type well regions (HVPW). The conductivity types of the well regions 905 and 906 are N-type (second conductivity type), and the well regions 905 and 906 may be implemented as N-type deep well regions (DHVNW). In order to clearly illustrate the arrangement and the conductivity types of the well regions 903-906, hereinafter, the well regions 903 and 904 are referred to as high-voltage P-type well regions, and the well regions 905 and 906 are referred to as N-type deep well regions. Referring to FIG. 9, the high-voltage P-type well region 903 is disposed between the N-type deep well regions 905 and 906, and the N-type deep well region 906 is disposed between the high-voltage P-type well regions 903 and 904. The bottom surface of the high-voltage P-type well region 903, the bottom surface of the high-voltage P-type well region 904, the bottom surface of the N-type deep well region 905, and the bottom surface of the N-type deep well region 906 are all connected to or contact with the buried layer 902.

As shown in FIG. 9, the doped region 907 is disposed on the high-voltage P-type well region 903, the doped region 908 is disposed on the high-voltage P-type well region 903 and the N-type deep well region 906, and the doped region 909 is disposed on the high-voltage P-type well region 906. The conductivity types of the doped regions 907 and 909 are P-type, and the doped regions 907 and 909 may be implemented as P-type well regions. The conductivity type of the doped region 908 is N-type, and the doped region 908 may be implemented as an N-type well region. In order to clearly illustrate the arrangement and the conductivity types of the well regions 907-909, hereinafter, the doped regions 907 and 909 are referred to as P-type well regions, and the doped region 908 is referred to as a N-type well region. Referring to FIG. 9, the P-type well region 907 is disposed on the high-voltage P-type well region 903, and the boundary of the P-type well region 907 is surrounded by the high-voltage P-type well region 903.

The N-type well region 908 has two sidewalls W908A and W908B that are opposite to each other. The N-type well region 908 extends from the N-type deep well region 906 to the high-voltage P-type well region 903 so that the sidewall W111A of the N-type well region 908 is in contact with the high-voltage P-type well region 903, that is, the sidewall W908A is in the high-voltage P-type well region 903. The sidewall W908B of the N-type well region 908 is in contact with the N-type deep well region 906, that is, the sidewall W908B is in the N-type deep well region 906. Therefore, the N-type well region 908 partially overlaps with the high-voltage P-type well region 903 and further partially overlaps the N-type deep well region 906.

The P-type well region 909 partially overlaps the N-type deep well region 906 and further partially overlaps the high-voltage P-type well region 904. The P-type well region 909 has two sidewalls W909A and W909B that are opposite to each other. As shown in FIG. 9, the sidewall W909A of the P-type well region 909 is in contact with the N-type deep well region 906, that is, the side wall W909A is in the N-type deep well region 906; the sidewall W909B of the P-type well region 909 is in contact with the high-voltage P-type well region 904, that is, the sidewall W909B is in the high-voltage P-type well region 904.

As shown in FIG. 9, the doped regions 910-912 are all disposed on the P-type well region 907. The doped region 910 is adjacent to the N-type deep well region 905, the doped region 912 is adjacent to the N-type well region 908, and the doped region 911 is disposed between the doped regions 910 and 912. The doped regions 910-912 are coupled to the bonding pad 90. In the embodiment, the conductivity type of the doped region 911 is P-type, and the doped region 911 may be implemented as a P-type heavily doped (P+) region. In addition, the conductivity types of the doped regions 910 and 912 are N-type, and the doped regions 910 and 912 may be implemented as N-type heavily doped (N+) regions. In order to clearly illustrate the arrangement and the conductivity types of the doped regions 910-912, hereinafter, the doped region 911 is referred to as a P-type doped region, and the doped regions 910 and 912 are referred to as N-type doped regions.

Referring to FIG. 9, the doped region 916 is disposed on the N-type well region 908. In the embodiment, the conductivity type of the doped region 916 is N-type, and the doped region 916 may be implemented as an N-type heavily doped (N+) region. In order to clearly illustrate the arrangement and the conductivity type of the doped region 916, hereinafter, the doped region 916 is referred to as an N-type doped region.

As shown in FIG. 9, both of the doped regions 913 and 914 are disposed on the P-type well region 909. The doped region 913 is adjacent to the N-type deep well region 906, and the doped region 914 is adjacent to the high-voltage P-type well region 904. The doped regions 913 and 914 are coupled to the ground terminal TGND. In the embodiment, the conductivity type of the doped region 913 is P-type, and the doped region 913 is implemented as a P-type heavily doped (P+) region. The conductivity type of the doped region 914 is N-type, and the doped region 914 may implemented as an N-type heavily doped (N+) region. In order to clearly illustrate the arrangement and the conductivity types of the doped regions 913 and 914, hereinafter, the doped region 913 is referred to as a P-type doped region, and the doped region 914 is referred to as an N-type doped region.

The doped region 915 is disposed on the high-voltage P-type well region 904 and coupled to the ground terminal TGND. In the embodiment, the conductivity type of the doped region 914 is P-type, and the doped region 914 may be implemented as a P-type heavily doped (P+) region.

Referring to FIG. 9, the isolation patterns 917-923 are disposed on the epitaxial layer 901. In the embodiment, the isolation patterns 917-923 may be shallow trench isolation (STI) features. Referring to FIG. 9, the isolation pattern 917 fully covers the N-type deep well region 905 and further partially covers the high-voltage P-type well region 903, the isolation pattern 918 is disposed between the N-type doped region 910 and the P-type doped region 911, and the isolation pattern 919 is disposed between the P-type doped region 911 and the N-type doped region 912, and the isolation pattern 920 is disposed between the N-type doped region 912 and the N-type doped region 916. In addition, the isolation pattern 921 is disposed between the N-type doped region 916 and the P-type doped region 913, the isolation pattern 922 is disposed between the N-type doped region 914 and the P-type doped region 915, and the isolation pattern 923 partially covers the high-voltage P-type well region 904.

In the embodiment shown in FIG. 9, the equivalent circuit of the electrostatic discharge protection device 9 comprises equivalent elements 20-24 shown in FIG. 6. Referring to FIG. 9 and FIG. 6, the P-type doped region 911, the P-type well region 907, the high-voltage P-type well region 903, the N-type buried layer 902, the N-type deep well region 906, the P-type well region 909, and the P-type doped region 913 commonly form the PNP BJT 20, wherein the P-type doped region 911, the P-type well region 907, and the high-voltage P-type well region 903 serve as the first collector/emitter of the PNP BJT 20, and the N-type buried layer 902 and the N-type deep well region 906 serve as the base of the PNP BJT 20, and the P-type well region 909 and the P-type doped region 913 serve as the second collector/emitter of the PNP BJT 20. The first collector/emitter of the PNP BJT 20 is coupled to the bonding pad 90, and the second collector/emitter of the PNP BJT 20 is coupled to the ground terminal TGND.

The N-type doped region 912, the P-type well region 907, the high-voltage P-type well region 903, the N-type well region 908, and the N-type doped region 916 commonly form the NPN BJT 21, wherein the N-type doped region 912 serves as the emitter of the NPN BJT 21, the P-type well region 907 and the high-voltage P-type well region 903 serve as the base of the NPN BJT 21, and the N-type well region 908 and N-type doped region 916 serve as the collector of the NPN BJT 21. The N-type doped region 914, the P-type well region 909, the N-type deep well region 906, the N-type well region 908, and the N-type doped region 916 commonly form the NPN BJT 22, wherein the N-type doped region 914 serves as the emitter of the NPN BJT 22, the P-type well region 909 serves as the base of the NPN BJT 22, and the N-type deep well region 906, the N-type well region 908, and the N-type doped region 916 serve as the collector of the NPN BJT 22. Referring to FIG. 6, according to the structure in FIG. 9, the emitter and the base of the NPN BJT 21 are coupled to the bonding pad 90, and the collector of the NPN BJT 21, the base of the PNP BJT 20, and the collector of the NPN BJT 22 are coupled to the node N20, the emitter and the base of the NPN BJT 22 are coupled to the ground terminal TGND. The node N20 corresponds to the N-type buried layer 902, the N-type deep well region 906, the N-type well region 908, and the N-type doped region 916 whose conductivity types are N-type and which are connected to each other in FIG. 9.

Referring to FIG. 9, when an electrostatic discharge event occurs on the bonding pad 90 to cause a positive voltage (or, when a positive electrostatic discharge event occurs on the bonding pad 10), a discharge path is formed through the bonding pad 90, the P-type doped region 911, the P-type well region 907, the high-voltage P-type well region 903, the N-type well region 908, the N-type deep well region 906, the P-type well region 909, the N-type doped region 914, and the ground terminal TGND so that the electrostatic charges on the bonding pad 90 are conducted to the ground terminal TGND through this discharge path. That is, the above discharge path is from the bonding pad 90 and finally to the ground terminal TGND through a P-N-P-N junction. From the viewpoint of the equivalent circuit of the electrostatic discharge protection device 9, referring to FIG. 6, when an electrostatic discharge event occurs on the bonding pad 90 to cause a positive voltage, the PNP BJT 20 and the NPN BJT 22 are turned on. At this time, the first collector/emitter of the PNP BJT 20 serves as the emitter (indicated by the solid arrow). The PNP BJT 20 and the NPN BJT 22 form a silicon controlled rectifier (SCR). Corresponding to the discharge path on the semiconductor structure shown in FIG. 9, the electrostatic charge on the bonding pad 90 is conducted to the ground terminal TGND through the emitter and the base of the PNP BJT 20 and the collector, the base and the emitter of the NPN BJT 22 in sequence.

Referring to FIG. 9, when an electrostatic discharge event occurs on the bonding pad 90 to cause a negative voltage (or, when a negative electrostatic discharge event occurs on the bonding pad 90), a discharge path is formed through the ground terminal TGND, the P-type doped region 913, the P-type well region 909, the N-type deep well region 906, the N-type well region 908, the high-voltage P-type well region 903, the P-type well region 907, the N-type doped region 912, and the bonding pad 90 so that the charges on the ground terminal TGND are conducted to the bonding pad 90 through this discharge path. That is, the above discharge path is from the ground terminal TGND and finally to the bonding pad 10 through a P-N-P-N junction. From the viewpoint of the equivalent circuit of the electrostatic discharge protection device 9, referring to FIG. 6, when an electrostatic discharge event occurs on the bonding pad 90 to cause a negative voltage, the PNP BJT 20 and the NPN BJT 21 are turned on. At this time, the second collector/emitter of the PNP BJT 20 serves as the emitter (indicated by the hollow arrow). The PNP BJT 20 and the NPN BJT 21 form a silicon controlled rectifier (SCR). Corresponding to the discharge path on the semiconductor structure in FIG. 1, the charges on the ground terminal TGND are conducted to the bonding pad 90 through the emitter and the base of the PNP BJT 20 and the collector, the base, and the emitter of the NPN BJT 21 in sequence.

Referring to FIG. 9, the high-voltage P-type well region 903 and N-type well region 908 form a third parasitic diode, and the P-type well region 909 and the N-type deep well region 906 form a fourth parasitic diode. The respective breakdown voltages of the third parasitic diode and the fourth parasitic diode may be determined by changing the position of the N-type well region 908 relative to the N-type deep well region 906.

Figure 10:
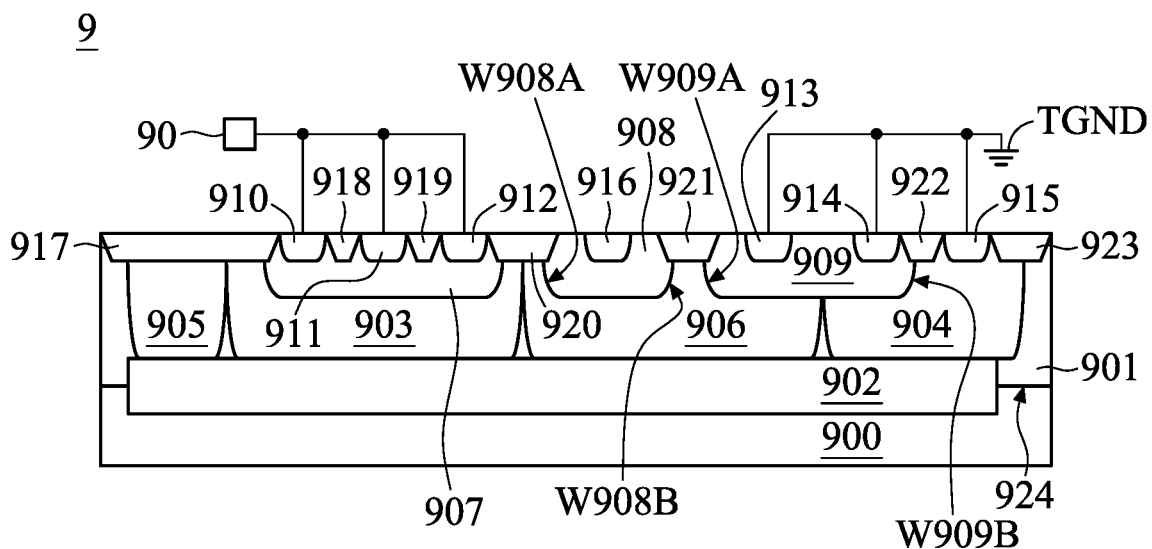
FIG. 10 is a schematic cross-sectional view of an electrostatic discharge protection device according to another embodiment of the present invention.

Referring to FIG. 10, the boundary of the N-type well region 908 is surrounded by the N-type deep well region 906. Both of the sidewalls W908A and W908B of the N-type well region 908 contact with the N-type deep well region 906, that is, both of the sidewalls W908A and W908B are in the N-type deep well region 906. Therefore, the N-type well region 908 does not overlap the high-voltage P-type well region 903. Compared with FIG. 9, in FIG. 10, the breakdown voltage of the third parasitic diode formed in the high-voltage P-type well region 903 and the N-type deep well region 906 is higher. In addition, in the embodiment of FIG. 10, the breakdown voltage of the third parasitic diode is higher than the breakdown voltage of the fourth parasitic diode formed in the P-type well region 909 and the N-type deep well region 906, which is beneficial to trigger formation of a discharge path when a positive electrostatic discharge event occurs on the bonding pad 90.

Figure 11:
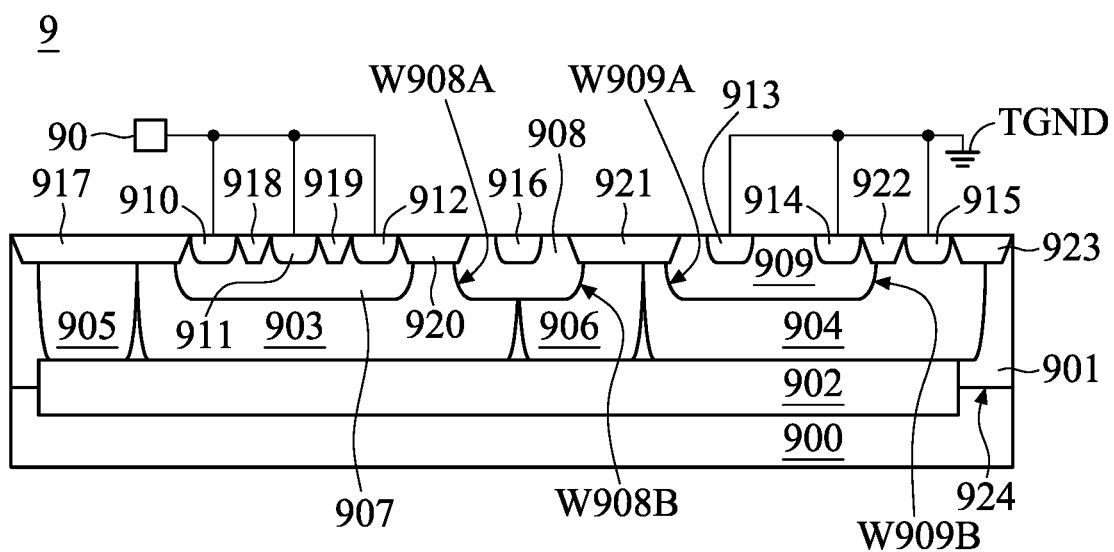
FIG. 11 is a schematic cross-sectional view of an electrostatic discharge protection device according to another embodiment of the present invention.

Referring to FIG. 11, the boundary of the P-type well region 909 is surrounded by the high-voltage P-type well region 904. Both of the sidewalls W909A and W909B of the P-type well region 909 contact with the high-voltage P-type well region 904, that is, both of the sidewalls W909A and W909B are in the high-voltage P-type well region 904. Therefore, the P-type well region 909 does not overlap the N-type deep well region 906. Compared with FIG. 9, the breakdown voltage of the fourth parasitic diode formed in the high-voltage P-type well region 904 and the N-type deep well region 906 in FIG. 11 is higher. In addition, in the embodiment of FIG. 11, the breakdown voltage of the fourth parasitic diode is higher than the breakdown voltage of the third parasitic diode formed in the high-voltage P-type well region 903 and the N-type well region 908, which is beneficial to trigger formation of a discharge path when a negative electrostatic discharge event occurs on the bonding pad 90.

According to the above-mentioned embodiments, the electrostatic discharge protection device 1 (or the electrostatic discharge protection device 5, or the electrostatic discharge protection device 9) proposed by the present invention provides a bidirectional discharge path. When a positive electrostatic discharge event or a negative electrostatic discharge event occurs on the bonding pad 10 (or the bonding pad 90), a current path formed by a P-N-P-N junction of a silicon controlled rectifier is provided, which result in a fast discharge rate.

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An electrostatic discharge protection device comprising:
   a semiconductor substrate having a first conductivity type;
   an epitaxial layer disposed on the semiconductor substrate, wherein the epitaxial layer has the first conductivity type;
   a first well region disposed in the epitaxial layer, wherein the first well region has the first conductivity type;
   a second well region disposed in the epitaxial layer, wherein the second well region has the first conductivity type;
   a third well region disposed in the epitaxial layer and disposed between the first well region and the second well region, wherein the third well region has a second conductivity type that is the opposite of the first conductivity type;
   a first doped region disposed on the first well region, wherein the first doped region has the first conductivity type;
   a second doped region disposed on the first well region, wherein the second doped region has the second conductivity type;
   a third doped region disposed on the second well region, wherein the third doped region has the first conductivity type;
   a fourth doped region disposed on the second well region, wherein the fourth doped region has the second conductivity type;
   a fifth doped region, disposed on the third well region, wherein the fifth doped region has the second conductivity type; and
   a sixth doped region disposed in the fifth doped region, wherein the sixth doped region has the second conductivity type,
   wherein the first doped region and the second doped region are coupled to a bonding pad, and the third doped region and the fourth doped region are coupled to a ground terminal, and
   wherein in response to an electrostatic discharge event occurring on the bonding pad, a discharge path is formed between the bonding pad and the ground terminal.

2. The electrostatic discharge protection device as claimed in claim 1, further comprising:
   a first gate structure disposed on the first well region and between the second doped region and the fifth doped region; and
   a second gate structure disposed on the second well region and between the fifth doped region and the fourth doped region,
   wherein the first gate structure is coupled to the bonding pad, and the second gate structure is coupled to the ground terminal.

3. The electrostatic discharge protection device as claimed in claim 2, wherein the fifth doped region extends toward the first well region and the second well region and is in contact with the first well region and the second well region.

4. The electrostatic discharge protection device as claimed in claim 2, wherein:
   the fifth doped region has a first sidewall and a second sidewall opposite to the first sidewall, the first sidewall of the fifth doped region is in contact with the third well region, and the fifth doped region extends toward the second well region, and the second sidewall of the fifth doped region is in contact with the second well region.

5. The electrostatic discharge protection device as claimed in claim 2, wherein:
   the fifth doped region has a first sidewall and a second sidewall opposite to the first sidewall,
   the fifth doped region extends toward the first well region, and the first sidewall of the fifth doped region is in contact with the first well region, and
   the second sidewall of the fifth doped region is in contact with the third well region.

6. The electrostatic discharge protection device as claimed in claim 2, further comprising:
   a buried layer disposed at an interface between the semiconductor substrate and the epitaxial layer and connected to a bottom surface of the first well region and a bottom surface of the third well region,
   wherein the buried layer has the second conductivity type.

7. The electrostatic discharge protection device as claimed in claim 6, further comprising:
   a fourth well region disposed in the epitaxial layer,
   wherein the fourth well region has the second conductivity type, and
   wherein the first well region is set between the third well region and the fourth well region, and the buried layer is further connected with a bottom surface of the fourth well region.

8. The electrostatic discharge protection device as claimed in claim 1, further comprising:
   a seventh doped region disposed on the first well region, wherein the seventh doped region has the first conductivity type; and
   an eighth doped region, disposed on the second well region, wherein the eighth doped region has the first conductivity type,
   wherein the first doped region and the second doped region are disposed in the seventh doped region, and the third doped region and the fourth doped region are disposed in the eighth doped region.

9. The electrostatic discharge protection device as claimed in claim 8, wherein a boundary of the fifth doped region is surrounded by the third well region.

10. The electrostatic discharge protection device as claimed in claim 9, wherein a boundary of the eighth doped region is surrounded by the second well region.

11. The electrostatic discharge protection device as claimed in claim 9, wherein the eighth doped region is further disposed on the third well region.

12. The electrostatic discharge protection device as claimed in claim 8, wherein:
   the fifth doped region has a first sidewall and a second sidewall opposite to the first sidewall,
   the first sidewall of the fifth doped region is in contact with the third well region, and
   the fifth doped region extends toward the second well region, and the second sidewall of the fifth doped region is in contact with the second well region.

13. The electrostatic discharge protection device as claimed in claim 8, wherein:
   the fifth doped region has a first sidewall and a second sidewall opposite to the first sidewall,
   the fifth doped region extends toward the first well region, and the first sidewall of the fifth doped region is in contact with the first well region, and
   the second sidewall of the fifth doped region is in contact with the third well region.

14. The electrostatic discharge protection device as claimed in claim 13, wherein a boundary of the eighth doped region is surrounded by the second well region.

15. The electrostatic discharge protection device as claimed in claim 13, wherein the eighth doped region is further disposed on the third well region.

16. The electrostatic discharge protection device as claimed in claim 8, wherein the second doped region is separated from the sixth doped region by a first isolation pattern, and the fourth doped region is separated from the sixth doped region by a second isolation pattern.

17. The electrostatic discharge protection device as claimed in claim 8, further comprising:
   a ninth doped region disposed in the seventh doped region and coupled to the bonding pad,
   wherein the ninth doped region has the second conductivity type, and the first doped region is disposed between the ninth doped region and the second doped region.

18. The electrostatic discharge protection device as claimed in claim 8, further comprising:
   a ninth doped region disposed in the seventh doped region and coupled to the bonding pad, wherein the ninth doped region has the second conductivity type, and the first doped region is disposed in the ninth doped region between the ninth doped region and the second doped region, and
   a tenth doped region disposed in the second well region and coupled to the ground terminal, wherein the tenth doped region has the first conductivity type, and the fourth doped region is disposed between the third doped region and the tenth doped region.

19. The electrostatic discharge protection device as claimed in claim 8, further comprising:
   a buried layer disposed at an interface between the semiconductor substrate and the epitaxial layer and connected to a bottom surface of the first well region and a bottom surface of the third well region,
   wherein the buried layer has the second conductivity type.

20. The electrostatic discharge protection device as claimed in claim 19, further comprising:
   a fourth well region disposed in the epitaxial layer,
   wherein the fourth well region has the second conductivity type, and
   wherein the first well region is disposed between the third well region and the fourth well region, and the buried layer is further connected to a bottom surface of the fourth well region, and
   wherein the buried layer is further connected to a bottom surface of the second well region.

* * * * *